United States Patent
Ackerman et al.

(10) Patent No.: US 6,690,689 B2
(45) Date of Patent: Feb. 10, 2004

(54) APPARATUS AND METHOD FOR COMPENSATING FOR AGE INDUCED WAVELENGTH DRIFT IN TUNABLE SEMICONDUCTOR LASERS

(75) Inventors: David A. Ackerman, Hopewel, NJ (US); Eric J. Dean, Allentown, PA (US)

(73) Assignee: Triquint Technology Holding, Co., Hillsboro, OR (US)

( * ) Notice: Subject to any disclaimer, the term of this patent is extended or adjusted under 35 U.S.C. 154(b) by 0 days.

(21) Appl. No.: 10/157,452

(22) Filed: May 29, 2002

(65) Prior Publication Data

US 2003/0223470 A1 Dec. 4, 2003

(51) Int. Cl.[7] ................................................ H01S 3/10
(52) U.S. Cl. ................ 372/20; 372/38.07; 372/29.015; 372/99; 372/102; 372/32
(58) Field of Search ............................ 372/20, 102, 99, 372/32, 29.015, 38.07

(56) References Cited

U.S. PATENT DOCUMENTS

| | | | | |
|---|---|---|---|---|
| 5,991,061 A | * | 11/1999 | Adams et al. | ............... 398/182 |
| 6,181,717 B1 | * | 1/2001 | Kner et al. | .................... 372/20 |
| 6,331,908 B1 | * | 12/2001 | Adams et al. | ............... 398/200 |
| 6,381,392 B1 | * | 4/2002 | Hayden et al. | ............. 385/132 |
| 2003/0035455 A1 | * | 2/2003 | Steffens | ........................ 372/50 |
| 2003/0063647 A1 | * | 4/2003 | Yoshida et al. | ................ 372/50 |
| 2003/0128724 A1 | * | 7/2003 | Morthier | ..................... 372/20 |
| 2003/0147432 A1 | * | 8/2003 | Bukkems | ..................... 372/20 |
| 2003/0147442 A1 | * | 8/2003 | Larson et al. | ................. 372/50 |

FOREIGN PATENT DOCUMENTS

EP  1 195 861 A2  4/2002

OTHER PUBLICATIONS

David A. Ackerman et al., "Assessment and Modeling of Aging in Electro–Absorption Distributed Bragg Reflector Lasers", IEEE Journal of Quantum Electronics, Nov. 2001, pp. 1382–1387, vol. 37, No. 11.

* cited by examiner

Primary Examiner—Leon Scott, Jr.
(74) Attorney, Agent, or Firm—Christie, Parker & Hale, LLP (57) ABSTRACT

The present invention provides a method and apparatus for compensating for the age induced wavelength drift in a tunable DBR. In practice, the tuning characteristic (i.e. output wavelength versus tuning current) of a tunable DBR may be characterized before and after factory aging, typically in the form of a burn-in or purge cycle. An aging vector may be constructed in accordance with the ratio of the change in the tuning characteristic associated with a second output wavelength and the change in the tuning characteristic associated with a first output wavelength as a function of the factory aging. In addition, the tuning characteristic associated with transmission at the first output wavelength may be monitored in the field. A controller may then update the value of the tuning characteristic associated with the second output wavelength to switch to the second output wavelength in manner that compensates for age induced wavelength drift as a function of the measured in field value of the tuning characteristic associated with transmission at a first output wavelength and said aging vector.

20 Claims, 11 Drawing Sheets

APPARATUS AND METHOD FOR COMPENSATING FOR AGE INDUCED WAVELENGTH DRIFT IN TUNABLE SEMICONDUCTOR LASERS

FIELD OF THE INVENTION

This invention relates generally to tunable optical transmitters, and more particularly to prediction methods for tunable semiconductor lasers for stabilizing such lasers and for maintaining a high side mode suppression ratio (SMSR).

BACKGROUND

Dense wavelength division multiplexed (DWDM) optical networks increase the information carrying capacity of a communication (e.g., transmission) system by loading multiple channels, each at a different carrier frequency or wavelength, onto a single optical fiber. It is advantageous in such systems to use optical sources (or transmitters) that can produce a spectrally narrow output at any one of a subset of the desired channel wavelengths. Distributed Bragg reflector (DBR) lasers are often used in DWDM systems because they typically have spectrally narrow outputs.

The output wavelength of a tunable DBR depends in part on the value of a tuning current. Typically the spectral output comprises a series of wavelength steps where the output wavelength remains relatively constant at each step for a finite range of tuning currents. However, as these systems are operated for long periods of time, DBR semiconductor lasers tend to degrade in performance due to aging and material defects. For single frequency semiconductor lasers the aging behavior is relatively well characterized and manifests itself in the form of reduced power output, and alteration of the output wavelength produced at a particular operating current. As a result, the output wavelength of semiconductor lasers may drift as the device ages.

Age induced wavelength drift may result in mode hopping where the device output abruptly switches to a different longitudinal mode. In a DWDM system, a channel experiencing a mode hop abruptly starts to operate in a mode (i.e., at a carrier wavelength) different from that originally assigned (e.g., at a channel wavelength different from that designated by an ITU grid point). Mode hopping may be avoided through closed loop wavelength feedback, which adjusts the value of the tuning current upon detection of the onset of a mode hop.

Additional closed loop wavelength feedback may also be used to provide low level side-band emissions by maintaining the tuning current near the center of the appropriate current step. However, in conventional systems, there is no guarantee that the beginning of life (BOL) values for any of the set points and control inputs of the device will be the correct values to use as the device ages. The result of this may be a "switch" to a channel other than the one desired by the system designer.

Therefore aging algorithms are often utilized to predict the operating currents of devices operating in the field. For a tunable laser, it is desirable to operate at the center of a tuning step. Inaccurate aging predictions that provide a tuning current near the edges of the appropriate current step may result in poor sidemode suppression and possibly an unintended mode hop. Accurate (but imperfect) predictions will still give an operating point with good sidemode suppression, but may lead to reduced performance for parameters like chirp and RIN.

SUMMARY OF THE INVENTION

In one aspect of the present invention a method for compensating for age induced changes in the tuning characteristic (referred to hereafter as wavelength drift) in a semiconductor laser includes constructing an aging matrix relating the change in th e tuning characteristic associated with one channel's desired operating point to the change in the tuning characteristic associated with another channel's desired operating point as a function of factory aging of the semiconductor laser. This aging matrix may be stored on a laser controller for future use. The controller may also monitor the change of the in field value of the tuning characteristic associated with the first output channel (a local channel). The controller may then calculate the value of the tuning characteristic for a non-local channel in accordance with the aging matrix, the amount of local channel aging, and the uncompensated tuning current for the non-local channel.

In another aspect of the present invention a method for operating a tunable DBR includes determining an aging vector in accordance with a ratio of change in a tuning characteristic associated with a non-local channel and change in tuning characteristic associated with a local channel as a function of factory aging of the tunable DBR, measuring the in field value of the tuning characteristic associated with transmission at the local channel and updating value of tuning characteristic to switch to the non-local channel in accordance with the measured in field value of the tuning characteristic associated with transmission at the local channel and said aging vector.

In another aspect of the present invention an apparatus includes a DBR transmitting at a local channel, a measurement apparatus for measuring the value of an in field tuning characteristic associated with the local channel and a controller, coupled to the DBR for switching the output wavelength of the DBR in accordance with an aging matrix relating the change in a tuning characteristic associated with the local channel to the change in the tuning characteristic associated with the non-local channel as a function of the factory aging of the DBR and the value of the in field tuning characteristic associated with the first output wavelength.

BRIEF DESCRIPTION OF THE DRAWINGS

These and other features, aspects, and advantages of the present invention will become better understood with regard to the following description, appended claims, and accompanying drawings, in which:

DETAILED DESCRIPTION OF THE INVENTION

An exemplary embodiment of the present invention provides a method and apparatus for determining an age compensated tuning current when switching channels in a DWDM optical network. The advantages of the present invention may be best understood in the context of an exemplary DWDM system having a wavelength tunable semiconductor laser transmitter.

Figure 1:
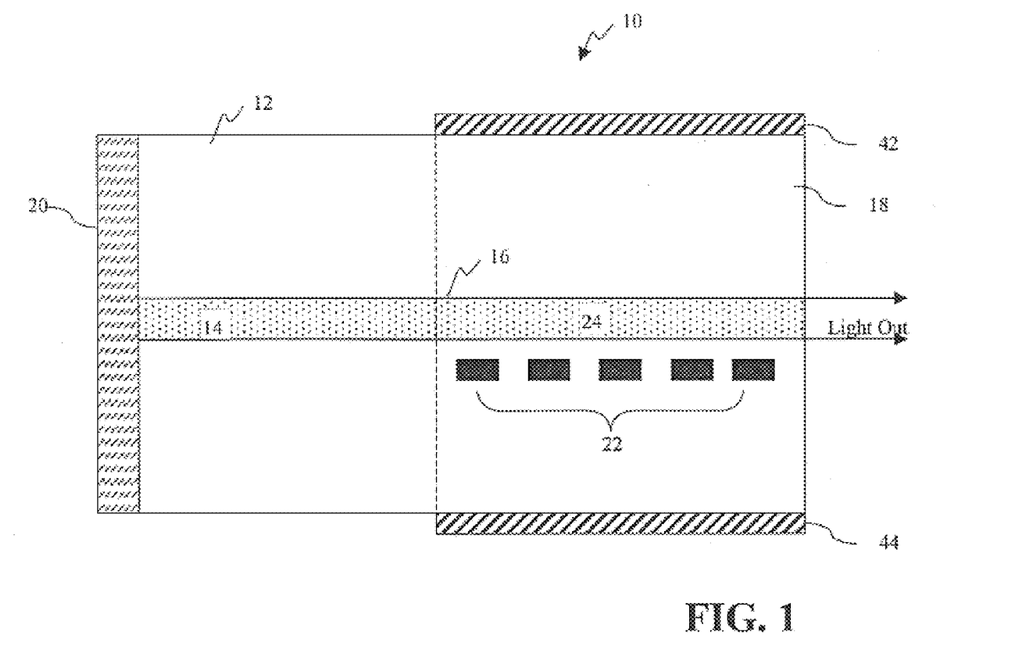
FIG. 1 is a cross-sectional view of a tunable DBR laser.

Referring to FIG. 1, an exemplary wavelength tunable semiconductor laser 10 may include a gain section 12 having a semiconductor active layer 14 within a portion of an optical cavity 16 that forms a Fabry-Perot cavity. The optical cavity 16 produces light in response to current injected into the active layer. The semiconductor laser may further comprise a tuning section 18, having a refractive index that varies in response to an electric field applied to the tuning layer. The active layer 14 of the optical cavity is bounded on one side by a reflector 20, such as for example a cleaved crystal face or a grating, and on a second side by the tuning section 18. The tuning section 18 functions as a tunable reflector for the laser's Fabry-Perot cavity.

Aging that occurs under actual use of the device may alter the physical properties of the tuning section such that there is an increased number of non-productive recombination mechanisms. The common non-productive mechanisms are monomolecular, bimolecular and Auger recombination. These mechanisms are often present (or enhanced) due to defects in the fabrication process.

In an exemplary embodiment the tuning section 18 may further comprise a Bragg grating 22 that is located adjacent to another portion 24 of the optical cavity 16. The Bragg grating functions as a distributed reflector of the laser's Fabry-Perot cavity by reflecting a portion of the light received form the cavity. In an exemplary embodiment the Bragg grating 22 has a spectrally selective reflectivity that enables tuning of the output wavelength of the DBR laser 10. In accordance with an exemplary embodiment, the selectivity of the Bragg grating attenuates optical side-band modes of the Fabry-Perot cavity to provide a relative high side mode suppression ratio.

Figure 2:
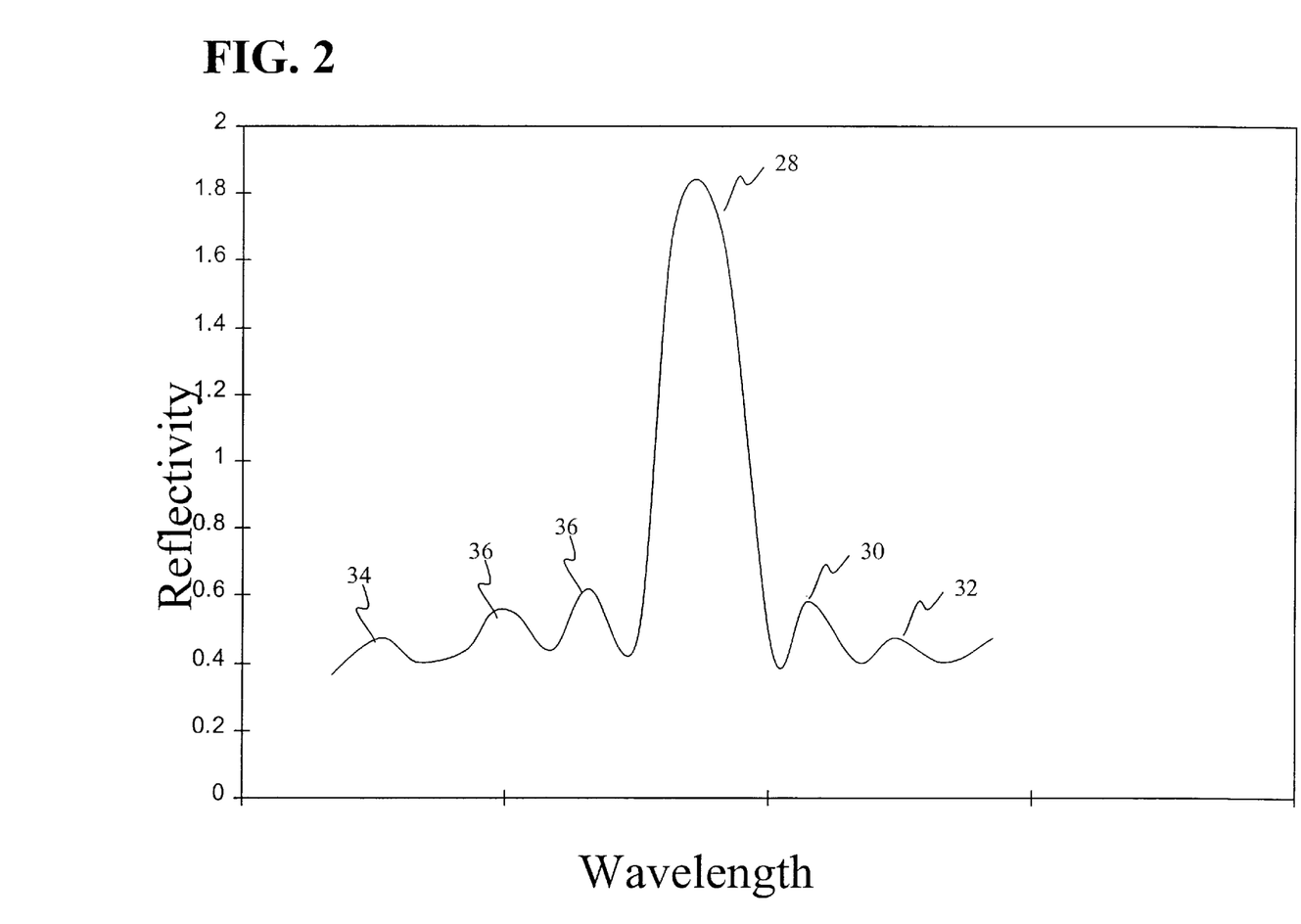
FIG. 2 graphically illustrates a reflection spectrum of a Bragg grating used in the tunable laser of FIG. 1.

FIG. 2 graphically illustrates the reflection spectrum of the described exemplary Bragg grating 22. In accordance with an exemplary embodiment, the reflection spectrum has a strong wavelength selectivity that is indicated by reflectivity variations between central peak 28 and side lobes 30–38. The wavelength of the central peak ($\lambda_m$) is referred to as the Bragg peak wavelength and is given by $2Ln_e(\lambda_m)/m$, i.e. the Bragg peak wavelength is $2L/m$ inside the tuning section 18. Here, L is the period of the Bragg grating 22, $n_e(\lambda_m)$ is an effective index of refraction in portion 24 of the optical cavity 16 in the tuning section 18.

In the described exemplary embodiment, the central Bragg peak may have a full-width half maximum in the range of about one to three nanometers and a reflectivity that is at least about two to four times larger than the reflectivity of any side lobe. Referring back to FIG. 1, the Bragg peak wavelength is controlled by the value of the tuning current applied to the tuning section 18 via electrical terminals 42 and 44. In operation, changing the value of the tuning current changes the effective index of refraction $n_e$, in portion 24 of the optical cavity 16 in the tuning section 18.

However, in operation aging may produce physical changes to the tuning section that alter the relationship between the value Add of the tuning current and the effective index of refraction $n_e$. For example, even though the tuning section 18 of the DBR laser 10 does not have the proper semiconductor properties to promote lasing, age related defects may provide favorable recombination sites for carriers injected into the tuning section. The recombination sites reduce the carrier lifetime as well as the effectiveness of the carriers in changing the refractive index of the semiconductor medium.

Previous efforts to model the age induced wavelength drift of a DBR experimentally modeled the recombination effects in the tuning section of a DBR. These experiments characterized the change in the Bragg wavelength of the DBR as a function of tuning current and fit the curve to a cubic polynomial. The linear, quadratic and cubic coefficients of this polynomial mapped to monomolecular, bimolecular and Auger recombination (denoted by symbols a, b, c) respectively, with the fit values in reasonable agreement to literature values.

Figure 3:
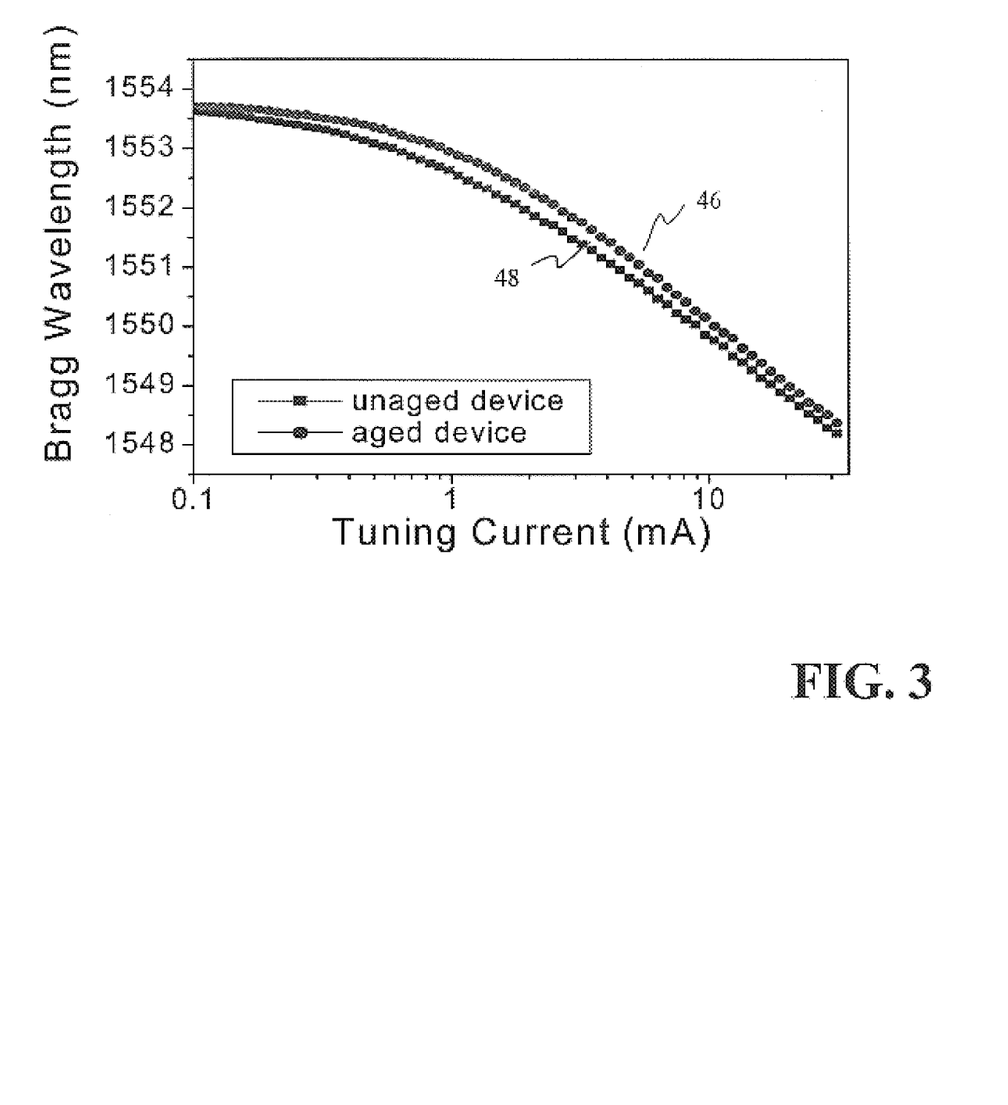
FIG. 3 graphically illustrates initial and aged Bragg wavelengths as a function of tuning current for the DBR of FIG. 1.

The devices were then aged under end of life (EOL) conditions and the measurements were repeated to characterize the change in Bragg wavelength as a function of the tuning current. FIG. 3 graphically illustrates the Bragg wavelength as a function of tuning current for an aged and unaged device 46 and 48 respectively. Post aging the curve characterizing the Bragg wavelength as a function of the tuning current may still be fit to a cubic polynomial. However, the "a" value (representing monomolecular recombination) changed (increased) during the aging process while the "b" and "c" values (representing bimolecular and Auger recombination respectively) did not. The increase in non-radiative recombination requires a higher tuning current to affect a desired change in Bragg wavelength, and analogously, a higher tuning current to stay on the center of a given tuning step while the device is lasing.

Figure 4:
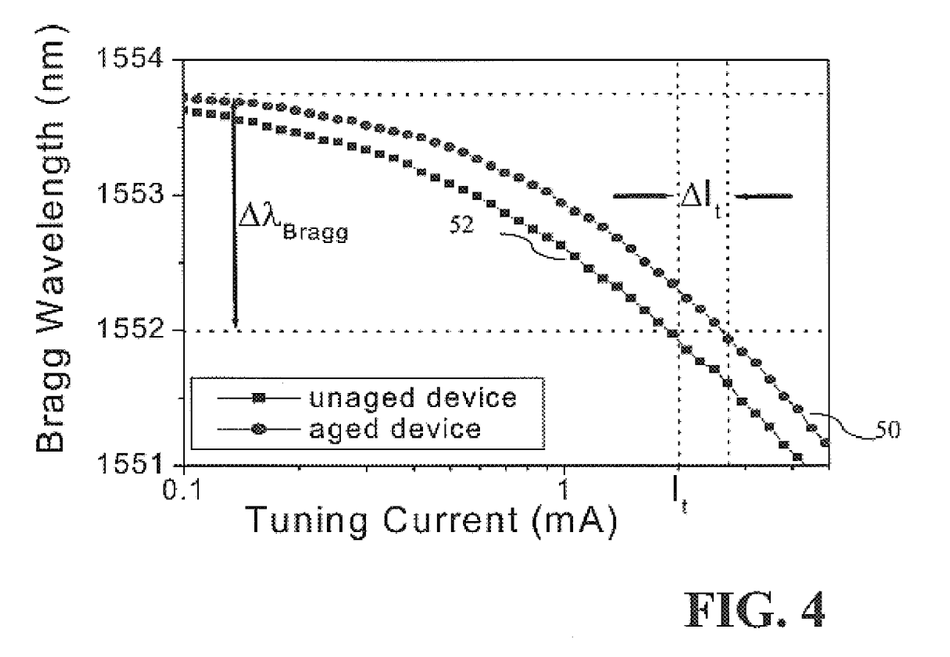
FIG. 4 graphically illustrates the age induced change to the relation between Bragg wavelength shift and tuning current for the DBR laser of FIG. 1.

Thus for a given shift in Bragg wavelength (which determines the tuning current) from the zero tuning current value the change in tuning current upon aging may be approximated by Eq. 1:

$$\Delta I_t = (\Delta a)^*(\Delta \lambda_{Bragg}) \tag{1}$$

where $\Delta I_t$ and $\Delta \lambda_{Bragg}$ are graphically illustrated in FIG. 4 for an aged and unaged device 50 and 52 respectively.

The value of monomolecular recombination (i.e. "a") can be measured both before and after aging so that the change in monomolecular recombination (i.e. $\Delta a$) may be empirically derived. Thus the change in tuning current can be determined given the shift in Bragg wavelength $\Delta\lambda_{Bragg}$. In operation, it is typically not possible to measure monomolecular recombination in the field. However, through manipulation of Eq. (1), it is not necessary.

Consider two Bragg wavelength shifts $\Delta\lambda_{Bragg,j}$ and $\Delta\lambda_{Bragg,k}$, corresponding to tuning currents $I_{tj}$ and $I_{tk}$ respectively. The aging process induces shifts in the tuning currents given by $\Delta I_{tj}$ and $\Delta I_{tk}$. For purposes of illustration it is assumed that point "j" denotes the local operating point, which will be monitored in the field, and point "k" denotes the non-local point that we wish to predict. Rearranging equation (1) yields:

$$\Delta a = \Delta I_{t,j}/(\Delta\lambda_{Bragg,j}) \tag{1'}$$

Applying equation (1') to a non-local operating point gives $$\Delta I_{t,k} = (\Delta a)*(\Delta\lambda_{Bragg,k}) = I_{t,j}/(\Delta\lambda_{Bragg,j})*(\Delta\lambda_{Bragg,j}) \tag{2}$$

Thus a non-local prediction may be made using only beginning of life (BOL) data (namely the relation between Bragg wavelength shift and tuning current) and local aging data. The only assumption made here is that the non-radiative recombination coefficient "a" is independent of tuning current.

Figure 5:
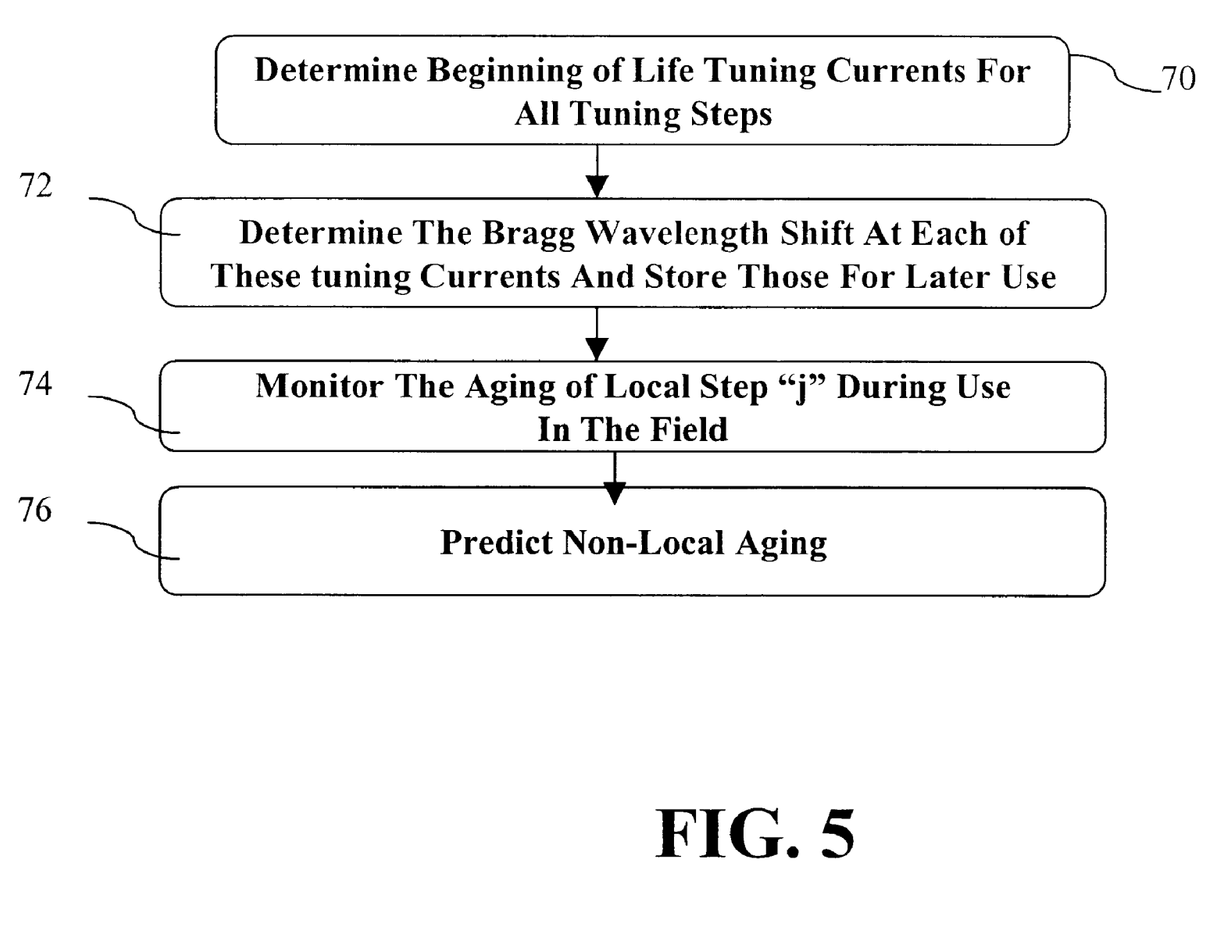
FIG. 5 is a flow chart illustrating a process for compensating for age induced wavelength drift in a DBR laser in accordance with the Bragg wavelength shift.

Assuming that the (lasing) tuning characteristic ages in the same manner as that of the Bragg wavelength, the aging of the Bragg wavelength versus tuning current curve may then be related to that of the Fabry-Perot (lasing) versus tuning current curve. For example, referring to FIG. 5, the desired beginning of life operating points (tuning currents) for all tuning steps for the device may first be determined 70. The Bragg wavelength shift at each of the tuning current may then be determined and stored for subsequent use 72. The aging of local step "j" may then be monitored in the field 74 and equation (2) above may then be used to predict the aging at a non-local operating point 76.

In practice the existing algorithm accurately corrects the tuning current values required to stabilize the output wavelength for relatively low values of tuning current (<30 mA), where the non-radiative recombination term "a" is predominant. Operating the device outside of this range of tuning currents may introduce additional aging effects that are not fully represented in the "a" and $\Delta a$ terms (for instance, changes in the bimolecular and Auger recombination coefficients). The limited scope of the physical model creates a need for a more accurate model.

Therefore, an exemplary process for predicting the age induced wavelength shift in a DBR may utilize an empirical model having multiple inputs. For example, the described exemplary in empirical model may utilize data acquired during the burn-in or purge of a semiconductor laser before it leaves the factory, where there are no restrictions on what type and how much data can be acquired.

Because of their complexity, processes for manufacturing semiconductor lasers do not always yield devices with consistent characteristics. The fabrication of a semiconductor laser typically involves numerous layers that depend on numerous parameters including, but not limited to, doping concentration, substrate temperature, material sources, and growth rate. Therefore, manufacturers of semiconductor lasers often use a burn-in procedure to cause device performance characteristics to stabilize and to induce early failure of weak devices. Both of these effects usually occur sometime after power has been applied to the device under operating conditions. Burn-in testing is typically conducted at elevated temperatures and currents for prolonged periods of time (e.g., 40–80 hours).

Therefore, data acquired before and after the burn-in process may provide a qualitative indication of how the device will age in the future. However, the magnitude of future aging will depend on the actual time in the field as well as the use conditions in the field. Therefore, an exemplary empirical model may also utilize data acquired on the local channel operating in the field to estimate the magnitude of age induced drift for a non-local channel that has occurred during actual in field operation. An exemplary process may therefore utilize the in field data and the data acquired before and after the burn-in process to construct a predictive model of the age induced wavelength drift of a DBR.

However, in some instances device parameters may have unusual aging characteristics. For example, the wavelength shift of a DFB laser under normal use often includes a transient red (or blue) wavelength shift as well as a blue (or red) shift as the device is aged further. This "reverse" in aging behavior makes it difficult to predict the level of age induced wavelength drift that may occur over the life of a device. The is tuning characteristic for a DBR laser may have similar transient behavior. Therefore an exemplary process for characterizing the affects of aging may include the ability to make "bidirectional" predictions.

Figure 6:
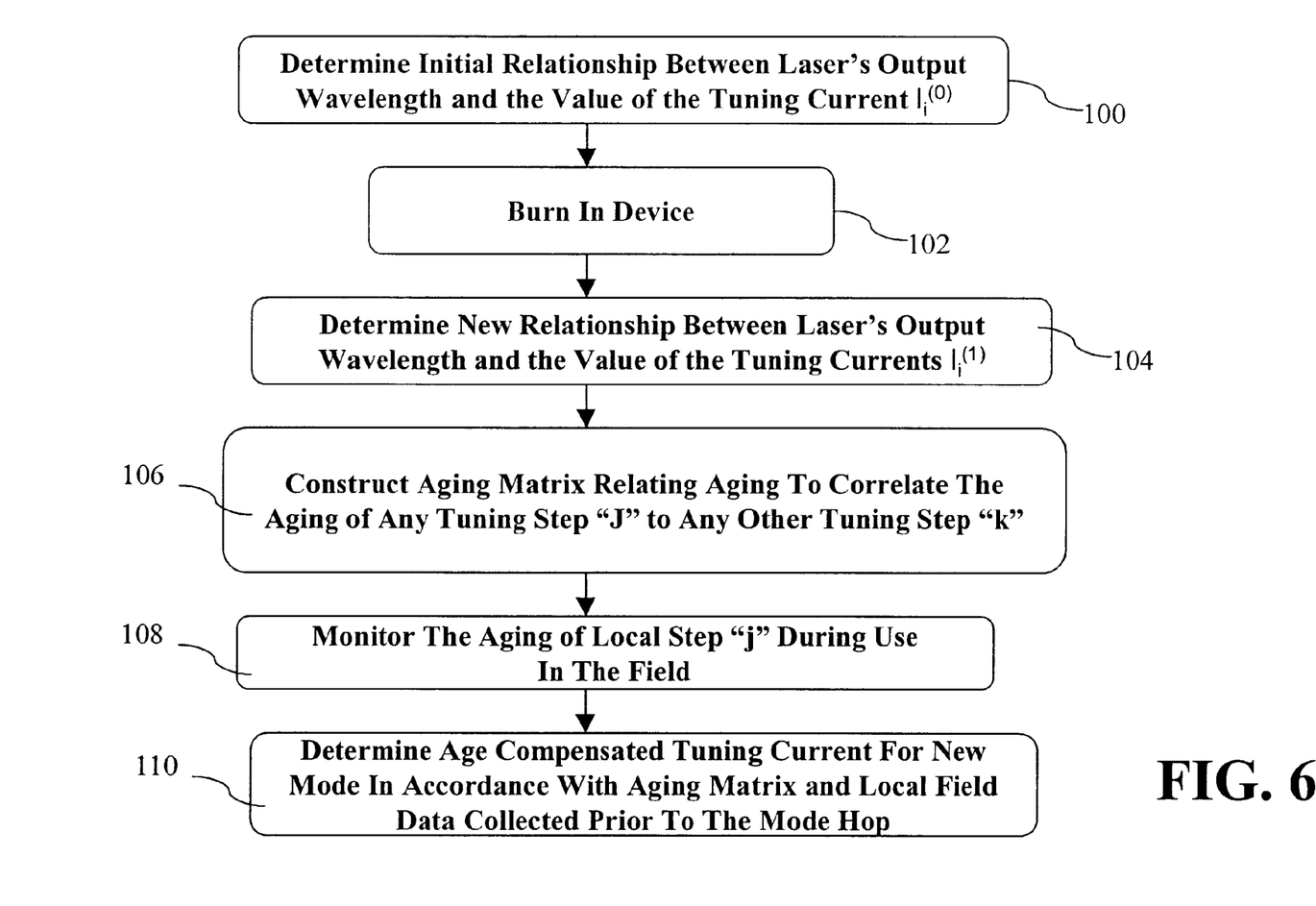
FIG. 6 is a flow chart illustrating an empirical process for compensating for age induced wavelength drift in a DBR laser in accordance with aging that occurs during burn-in and local aging that occurs for device operating in the field in accordance with an exemplary embodiment of the present invention.

FIG. 6 is a flow chart showing a process that compensates for age induced wavelength drift in a DBR laser, e.g. laser 10 of FIG. 1. The described exemplary process may determine an initial functional relation between the laser's output wavelength $\lambda$ and the value of the tuning current 100 for that output wavelength.

The determination of the initial functional relationship may be formulated in accordance with measurements of the output spectrum of the laser for one or more initial tuning current values. The relation may provide an operating characteristic such as a wavelength versus tuning current curve. Alternatively the tuning scan may provide an output wavelength and a value of the tuning current that produces that wavelength for each operating point. The operating point may be, for example, the value of tuning current at the center of a tuning step, or the tuning current value that maximizes the side mode suppression ratio (SMSR).

The device may now be aged through normal or accelerated use. In accordance with an exemplary process, the device may be aged by burning-in or purging the device under relatively high current and high temperature conditions 102. In the described exemplary process the output spectrum of the device may be re-measured to characterize the functional relation between the is laser's output wavelength $\lambda$ and tuning current post aging 104.

Therefore, in the described exemplary process the operating point for every tuning step "j" has been characterized before and after burn-in. The before and after tuning points may be denoted by $I_{tj}^{(0)}$ and $I_{tj}^{(1)}$, respectively where the superscript "0" denotes values measured before burn-in and the superscript "1" denotes values measured after burn-in.

An exemplary process may utilize the pre-aging and post aging tuning spectra to determine the change in tuning current $\Delta I_{tj}^{(1)(0)}$ for each operating point as illustrated in Eq. 3.

$$\Delta I_{tj}^{(1)(0)} = I_{tj}^{(1)} - I_{tj}^{(0)} \tag{3}$$

for j=1, . . . , N where N=# of tuning steps.

Figure 7:
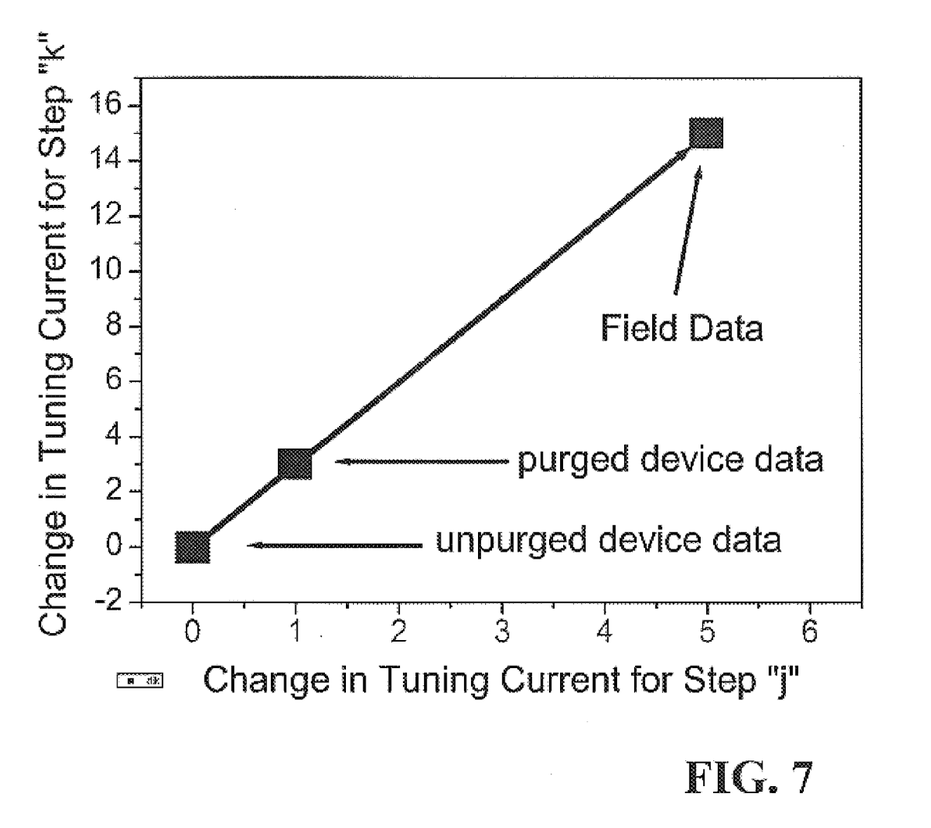
FIG. 7 graphically illustrates the empirical process of FIG. 6, wherein the relative change in tuning current for two tuning steps of a device during the purge process is measured, and that data are used to set a "direction" for future aging in accordance with an exemplary embodiment of the present invention.

In addition, an exemplary process may determine the relative aging of one tuning step "j" compared to the aging of another tuning step "k". The described exemplary process may then construct an aging "vector", that relates the aging of one tuning step to that of another tuning step, as illustrated in FIG. 7. An exemplary process may define the slope for this vector (there is a unique vector for each pair of tuning steps) according to Eq. 4.

$$A_{kj} = \Delta I_{tk}^{(1)(0)} / \Delta I_{tj}^{(1)(0)}, j, k=1, \ldots, N \quad (4)$$

Accordingly, referring back to FIG. 6, an exemplary process may construct an NxN aging matrix that correlates the aging of any tuning step "j" to the aging of any other tuning step "k" 106.

As a device undergoes in field use it may progress from a transient aging period to a steady state aging period. In operation the aging rate may change as a function of the aging time. However, in the described exemplary process it is assumed that the qualitative aging behavior of the device is independent of whether the device is in a transient or steady state aging period. Therefore, in accordance with an exemplary process the relative amount (ratio) of aging for any two tuning steps is assumed to be independent of time.

Accordingly, the aging vector acquired during burn-in provides a future "direction" for aging. Further, in the described exemplary process the absolute magnitude of the aging vector that results from the burn-in or purge process is not important. Rather, the described exemplary process may determine the axial direction of the aging vector from the pre-purge and post-purge data and the magnitude of the aging vector in accordance with the amount of local aging that occurs for the channel actually operating in the field (state "2").

For example, an exemplary process may perform in field measurements to characterize the operating point of the local channel operating in the field 108. The operating point may be, for example, the value of tuning current at the center of a tuning step, or the value of tuning current that maximizes SMSR. The described exemplary process may then characterize the amount of in field aging for local channel "j" according to Eq. 5.

$$\Delta I_{tj}^{(2)(1)} = I_{tj}^{(2)} - I_{tj}^{(1)}, j=1, \ldots, N = \text{\# of tuning steps} \quad (5)$$

where $I_{tj}^{(1)}$ is the post burn-in tuning current for channel j and $I_{tj}^{(2)}$ is the optimum tuning current for local channel j that reflects the in field use of the device. In the described exemplary process the qualitative aging behavior between tuning channels is assumed to be fixed so that the relative aging of two different device tuning steps "j" and "k" may be fixed by the aging vector element $A_{kj}$. The described exemplary process may then relate the aging of a non-local channel "k" to that of local channel "j" in accordance with Eq. 6 (step 110).

$$\Delta I_{tk}^{(2)(1)} = A_{kj} * \Delta I_{tj}^{(2)(1)} = (\Delta I_{tk}^{(1)(0)} / \Delta I_{tj}^{(1)(0)}) * \Delta I_{tj}^{(2)(1)} \quad (6)$$

Figure 8:
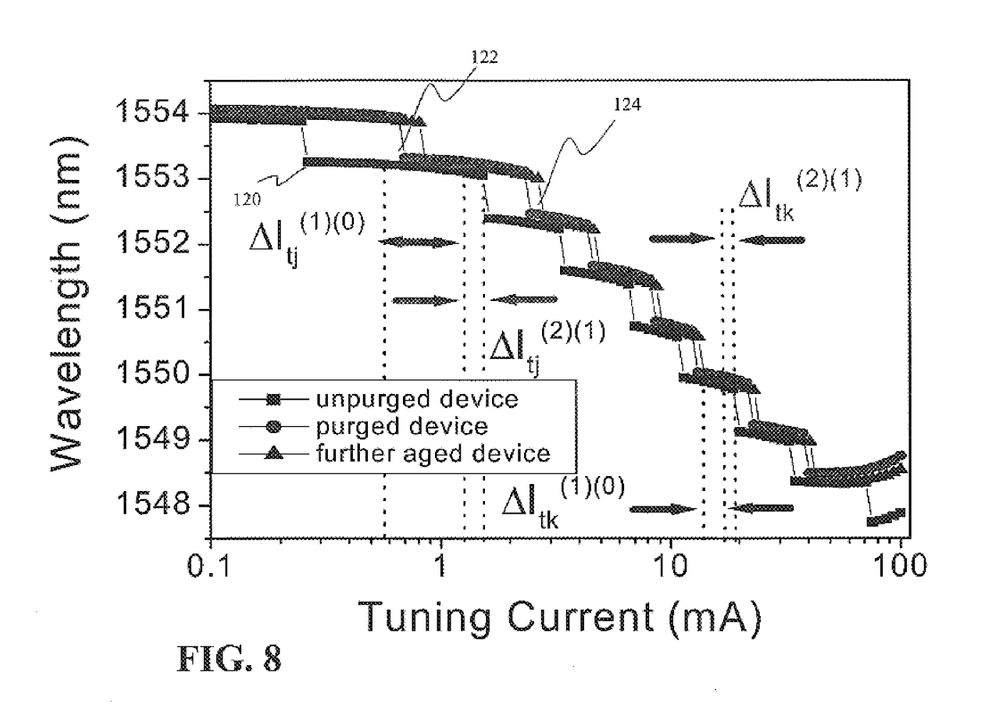
FIG. 8 graphically illustrates the wavelength versus tuning current for a device before factory purging, after factory purging and after in field use in accordance with an exemplary embodiment of the present invention.

FIG. 8 graphically illustrates the wavelength versus tuning current of an exemplary DBR laser that has not been aged 120, that has been burned in or purged 122 and that has been aged in the field 124. FIG. 8 further illustrates the change in tuning current pre and post purging for a local and non local channel $\Delta I_{tj}^{(1)(0)}$ and $\Delta I_{tk}^{(1)(0)}$ respectively as well the change in tuning current pre and post in field use for a local and non-local channel $\Delta I_{tj}^{(2)(1)}$ and $\Delta I_{tk}^{(2)(1)}$ respectively.

In operation the described exemplary process follows the axial direction of the aging "vector" illustrated FIG. 7 (direction mapped by pre and post burn-in data) and determines the magnitude of the aging vector (i.e. magnitude of wavelength drift) in accordance with the amount of local aging (i.e. change in output wavelength with tuning current) that occurs in the field. In addition, if a device begins aging in the opposite direction (i.e., tuning currents for operating points start decreasing rather than increasing), an exemplary process may utilize the aging vector constructed during burn-in, with the direction of the vector reversed by 180 degrees.

Figure 9:
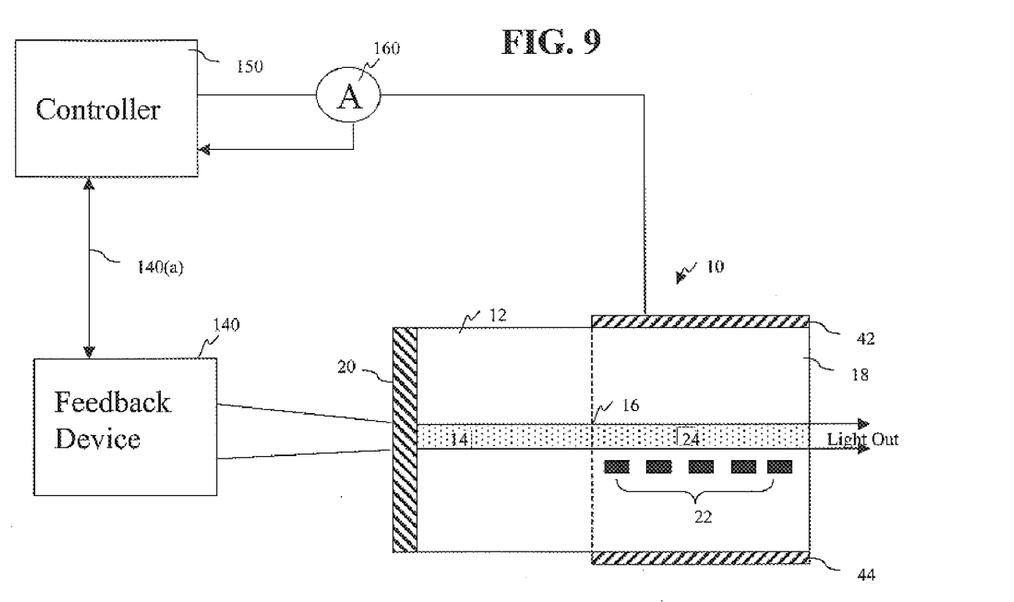
FIG. 9 is a simplified block diagram of an apparatus for compensating for the age induced wavelength drift of the DBR in FIG. 1, in accordance with the process illustrated in FIG. 6 in accordance with an exemplary embodiment of the present invention.

FIG. 9 is a simplified block diagram of an exemplary system for compensating for age induced wavelength drift in the DBR laser illustrated in FIG. 1. The system includes a closed loop wavelength feedback device 140 that stabilizes a single local operating channel against wavelength drift. In accordance with an exemplary embodiment, the feedback device 140 observes light leaking through back reflector 20 of the laser 10 and generates a calibration signal 140(a) that is indicative of changes to the operating wavelength of the laser 10. The calibration signal may be forwarded to a controller 150 that adjusts the tuning current applied to terminal 42 to compensate for wavelength drift in the DBR laser 10.

In accordance with an exemplary embodiment, the controller 150 may also receive a measured tuning characteristic of the DBR from a measurement apparatus. For example, in one embodiment, an ammeter 160 may measure the tuning current applied to the DBR and forward that value to the controller. One of skill in the art will appreciate however that other tuning characteristics such as voltage, sidemode performance, etc. In accordance with an exemplary process, the controller characterizes the wavelength drift of the local channel operating in the field in accordance with the measured value of the tuning characteristic. As previously described the controller may then utilize the post burn-in aging data and the in field aging data to switch to a new operating channel in a manner that compensates for aged induced wavelength drift for the new operating mode.

One of skill in the art will appreciate that the accuracy of the described exemplary process may be limited by the accuracy of the measured relationship between the tuning current and output wavelength of the device. In operation, if inaccurate measurements are incorporated into the aging matrix then inaccurate aging predictions and device failures may occur. In accordance with an exemplary process, device data (operating points) are taken before and after the burn-in. This data may, to some extent, be corrupted by noise inherent in the test set used to characterize the output wavelength as a function of the tuning current.

If a device undergoes substantial aging during the burn-in cycle, such that a large difference exists between the pre-burn-in and post burn-in tuning current for a particular channel, then system noise may constitute a relatively small perturbation relative to the change in tuning current. However, if the device experiences a relatively low level of aging (or even no aging) during burn-in, then noise may partially or completely corrupt the aging data needed for construction of the aging matrix.

Therefore, an exemplary process preferably accounts for the level of aging (i.e. wavelength drift) that a device undergoes during burn-in to ensure that reliable predictions on the age induced wavelength drift of a non-local channel are provided in the field. For example, an exemplary process for compensating for the effects of aging in a DBR, may utilize an empirical function as illustrated in Eq. 7 to estimate the shift in the operating point of each tuning step "j".

$$\Delta I_t^{(1)(0)}{}_{char} = 0.041 + 0.161 * I_t^{0.85} \quad (7)$$

It has been found that Eq. 7 substantially characterizes the actual measured pre to post burn-in shift in tuning characteristics of a plurality of devices. However, there may be some variation in the magnitude of the shift in the tuning characteristic from device to device and wafer to wafer. Therefore, an exemplary embodiment may include a multiplicative factor (C) on the right side of Eq. 7 to account for the magnitude variation from device to device.

An exemplary process may then measure the shift in the tuning characteristic (or at least the shift of the operating point for each tuning step) and compare the actual shift to the aging predicted by the empirical formulation provided in Eq. 7. For a device with N tuning steps, the described exemplary process performs N comparisons, i.e. comparing the actual aging of each tuning step with that predicted by Eq. 7. As a simplification, an exemplary process may utilize a tuning parameter ALF, the "aging lifetime factor", (defined in Eq. 8 below) to characterize how (on average) the entire tuning characteristic evolves relative to that modeled by the universal formula.

$$ALF = \Sigma (\Delta I_{tj}^{(1)(0)}/\Delta I_{t}^{(1)(0)}{}_{char})/N \; j=1, \ldots, N \quad (8)$$

In accordance with an exemplary process the sum may be taken over all of the tuning steps of the device. A small value of the ALF may be used to identify devices that do not age appreciably, such that the aging matrix for that device may be unreliable. A large value of the ALF indicates that the device undergoes sufficient aging during burn-in and that the aging matrix for such a device should be relatively accurate. That threshold point may be determined in significant part by the noise level in the test set used to measure the tuning characteristic.

For devices with relatively small tuning parameters ALF, little information is gained upon completion of the burn-in process apart from discovering that the device did not undergo significant aging. As a result, the aging prediction described in Eq. 7 may be used as an approximation to the aging behavior of the device. The fact that this formula may represent a larger amount of aging than seen during the burn-in process is relatively unimportant. The aging prediction described in Eq. 7 may be scaled by a constant to roughly replicate the shift in the tuning characteristic upon burn-in. In the described exemplary process this constant factor cancels out when constructing the aging matrix.

There is however, a tradeoff when determining the proper value of the ALF to use as a "threshold" for implementing the empirical estimate for constructing the aging matrix as opposed to using actual device data. In operation if the threshold is set too small, there will be devices that do not age much yet have actual device data (possibly corrupted by noise) used in constructing the aging matrix. Alternatively, if the threshold is set too high, then the empirical aging prediction described in Eq. 7 will be used for most devices, including some devices that undergo significant aging during burn-in whose actual aging behavior is not accurately represented by this formula.

In an exemplary embodiment of the present invention the empirical estimate described in Eq. 7 may be used to construct the aging matrix if the tuning parameter is less than or equal to about 1.1 (i.e. ALF<1.1). In addition, measured data may be used to construct the aging matrix if the tuning parameter is greater than about 1.1 and less than or equal to about 5 (i.e. 1.1 <ALF 5). Further, the described exemplary process may screen out devices that have an unacceptably large tuning parameter (e.g. ALF>5), because these devices may show unacceptable aging rates in the field resulting in early failure.

One of skill in the art will appreciate that the thresholds may vary in accordance with a variety of factors. For example, the lower threshold may vary in accordance with the precision of the test set and any uncertainties (at the device level) in the optimum operating point. In practice the lower threshold (i.e. the threshold for not perceiving any real aging) may be reduced if more precise measurement equipment and techniques are implemented (with the resulting manufacturing cost tradeoff). Using less precise measurements (bringing a time and cost savings for characterization) may introduce additional uncertainties into the pre and post-purge measured numbers and may compromise aging prediction in the field.

In operation, typical tuning section operating currents are in the 0.1–100 mA range. Tuning currents in this range can adequately be measured by most commercial equipment. Therefore, the disclosed threshold values are merely by way of example and not by way of limitation.

One of skill in the art will further appreciate that an exemplary process for characterizing the age induced drift in a DBR in the field should not only predict the effects of aging that do occur but also avoid introducing errors when aging does not occur. In operation there may be some amount of board level noise in a typical transmitter. For example, the circuits supplying current to the tuning section or the electronics reading data from the control outputs of the device may generate some level of system noise. Therefore, when a device operates on a single channel (prior to any channel changes), the tuning current may vary slightly around the original set point (due to noise effects), or it may drift (due to aging effects).

An exemplary process may therefore examine the change in tuning current relative to the beginning of life value when executing a switch to a different channel. The beginning of life value is noted here as the value of tuning current for post-burn-in data. If the percent change in tuning current is less than a predetermined threshold it may be advantageous not to implement an aging algorithm (which could introduce errors of its own). In one embodiment, the threshold may vary from channel to channel. In operation, if the threshold is set too large, the transmitter will be blind to the aging that does occur, introducing the risk of an incorrect channel jump and a device failure.

In accordance with an exemplary embodiment if the change in tuning current is less than about 1–2% of the beginning of life value the described exemplary process does not implement the aging algorithm. For typical DBR tuning sections, there may be up to sixteen distinct tuning steps in the 0.1–100 mA range. Assuming that the tuning steps are spaced relatively uniformly along this range, there will be a roughly 40% change in tuning current from one tuning step to an adjacent one. Therefore, an exemplary system may ignore changes in tuning current of less than about 1–2% without introducing a significant risk of jumping to an incorrect channel. For shifts in tuning current in the 1–2% range, the post-channel switch error in tuning current will be comparable to or less than the error inherent in any predictive algorithm.

An exemplary process for compensating for age induced wavelength drift may be further complicated by the density of channels in a DWDM network. For example, in many applications there may be more channels than tuning steps. For example, if the spacing of transmitter channels is 50 GHz and the tuning steps of the device are spaced 100 GHz apart, then the same tuning step may be used to lock on more than one transmitter frequency. In this instance an exemplary process may characterize the output wavelength for multiple tuning currents within a particular tuning step.

An exemplary process may then utilize the matrix element $A_{kj}$ along with the local aging data to determine the new current when switching from local tuning step "j" to any other tuning step "k" as previously illustrated in Eq. 6 and included again below.

$$\Delta I_{tk}^{(2)(1)} = \Delta I_{tj}^{(2)(1)} * A_{kj} \qquad (6)$$

In one embodiment, an exemplary process may utilize matrix element $A_{jj} = \Delta I_{tj}^{(1)(0)}/\Delta I_{tj}^{(1)(0)} = 1$ when switching channels within the same tuning step. In this instance Eq. 6 simplifies to:

$$\Delta I_{tk}^{(2)(1)} = \Delta I_{tj}^{(2)(1)} (j=k)$$

Therefore in operation, the change in tuning current for the local channel is the same as the change in tuning current for the non-local tuning channel if the same tuning step is used for the local and non-local channel.

Figure 10:
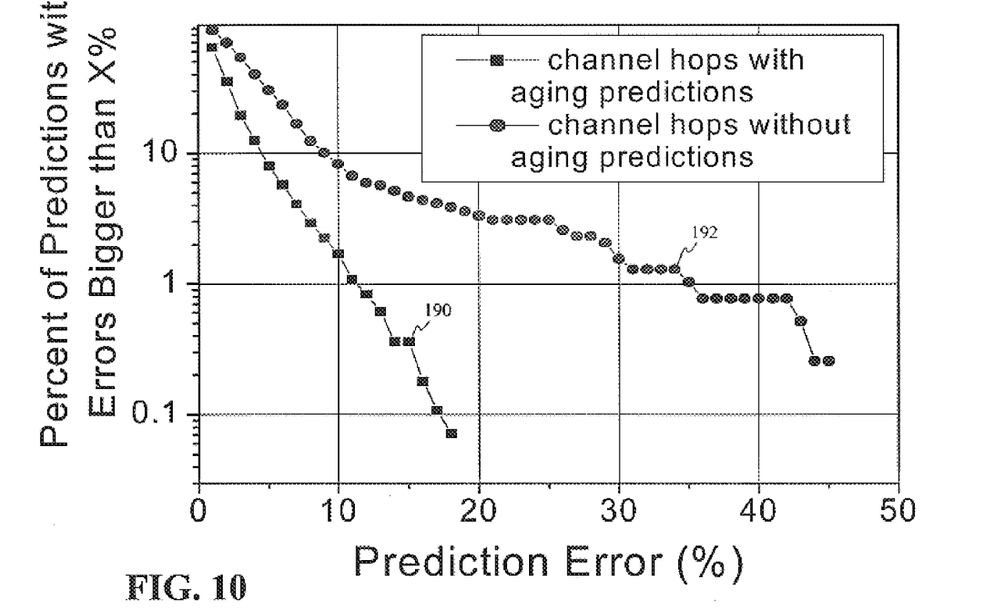
FIG. 10 graphically illustrates channel hopping errors for the DBR laser of FIG. 1 with and without compensation for age induced wavelength drift in accordance with an exemplary embodiment of the present invention.

FIG. 10 graphically illustrates the robustness of the described exemplary process for compensating for age induced wavelength drift in a DBR. The described exemplary aging correction process has been characterized over a large group of devices from a number of different wafers, with aging times ranging from 200 to 500 hours after the initial burn-in process. FIG. 10 graphically illustrates the channel hopping errors with and without the described exemplary aging algorithm 190 and 192 respectively. The illustrated data represents prediction errors relative to the full width of the tuning step. Therefore, prediction errors grater than +/−50% indicate that the prediction results in a switch to an incorrect tuning and a device failure.

However, in order to ensure robust operation, the prediction errors should be considerably less than the 50% level. For example, in one embodiment, the maximum prediction error may be on the order of about 18.5%, providing sufficient accuracy should a dither signal subsequently be impressed on the DC tuning current.

Figure 11:
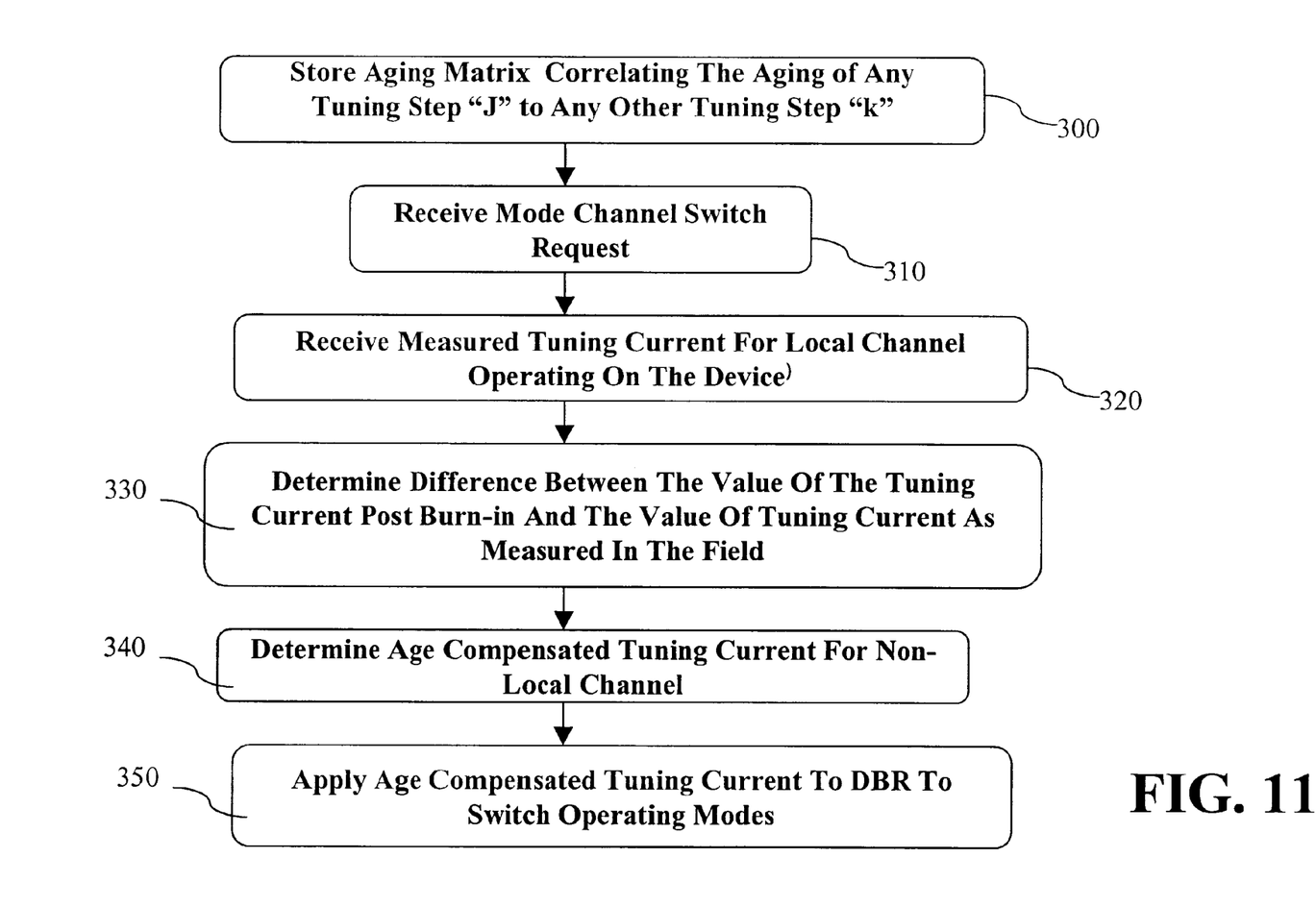
FIG. 11 is a flow chart illustrating the operation of the empirical process for compensating for age induced wavelength drift in the DBR of FIG. 1 in accordance with an exemplary embodiment of the present invention.

FIG. 11 is a flow chart for a process used by controller 150 of FIG. 9 to switch to a new mode in a manner that compensates for aging. In accordance with an exemplary embodiment, the controller stores an aging matrix that correlates the tuning current of any tuning step with the tuning current of any other tuning step 300. In accordance with an exemplary process the aging matrix may be constructed in accordance with an empirically derived formulation or in accordance with actual measurements of the output wavelength of the device as a function of tuning current pre and post burn-in.

In response to an external request to switch to a different operating channel 310 the controller may determine the age compensated tuning current for the new mode. In an exemplary embodiment, the controller receives a measured value of the tuning current for the local channel currently being transmitted 320 prior to switching to the new non-local channel. In operation the pre-switch tuning current for local tuning step "j" may differ from the post burn-in tuning current due to aging. The described exemplary process may therefore determine the difference between the value of the tuning current post burn-in and the value of tuning current as measured in the field prior to the receipt of the external request to switch to a different operating mode 330. In accordance with an exemplary process the qualitative aging behavior between tuning channels is assumed to be fixed so that the relative aging of two different tuning steps "j" and "k" may be fixed by the aging vector element $A_{kj}$.

The described exemplary process may then determine the age compensated tuning current of a non-local channel "k" in accordance with the product of the appropriate element in the aging matrix $A_{kj}$ and the change in tuning current for the local channel currently in use 340. The controller may then apply the calculated value of the tuning current for the non-local tuning step to electrical terminals 42 and 44 (see FIG. 9) to switch to the new operating mode 350.

Although an exemplary embodiment of the present invention has been described, it should not be construed to limit the scope of the appended claims. Those skilled in the art will understand that various embodiments of optical transmitters may use the process and apparatus illustrated in FIGS. 11 and 9 to control optical transmissions in a multi-channel DWDM network in a manner that compensates for age induced drift.

Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A method for compensation for wavelength shifts in a semiconductor laser, comprising the step of:
    forming a vector relating change in first tuning current associated with operation of the semiconductor laser at a first output channel to change in a second tuning current associated with operation of the semiconductor laser at a second output channel that results from operation of said semiconductor laser for a first period of time;
    monitoring an in field value of the first tuning current associated with the operation of the semiconductor laser at the first output channel while operating the semiconductor laser for a second period of time; and
    updating the value of the second tuning current associated with the operation of the semiconductor laser at the second output channel in accordance with said vector and the in field value of the first tuning current.

2. The method of claim 1 wherein the step of forming a vector comprises forming a vectro in accordance with an empirical estimation of changes of the first and second tuning currents that result from operation of the semiconductor device during the first period of time when an aging parameter is less than a predetermined threshold.

3. The method of claim 1 wherein the step of forming a vector comprises forming a vector in accordance with measured differences in the first and second tuning currents that result from operation of the semiconductor laser for the first period of time when an aging parameter is greater than a predetermined threshold.

4. The method of claim 1 wherein said semiconductor laser is driven by a predetermined current during the first period of time.

5. The method of claim 1 wherein the first tuning current comprises a value of a tuning current at a center of a tuning step that produces the first output channel.

6. The method of claim 1 wherein the first tuning current comprises a value of a tuning current that maximize SMSR at the first output channel.

7. The method of claim 1 further comprising the step of discarding said semiconductor laser when an aging parameter is greater than a predetermined threshold.

8. The method of claim 1 further comprising the step of determining difference between value of the first tuning current associated with operation of the semiconductor laser at the first output channel after the first period and the in field value of the first tuning current associated with operation of the semiconductor laser at the first output channel during the second period, wherein the updated value of the second tuning current associated with operation of the semiconductor laser at the second output channel is determined in accordance with said vector and said difference between the value of the first tuning current associated with operation of the semiconductor laser at the first output channel after the first period and in field value of the first tuning current associated with operation of the semiconductor laser at the first output channel during the second period.

9. The method of claim 1 further comprising the step of:
determining difference between the in field value of the first tuning current associated with operation of the semiconductor laser at the first output channel during operation in the second period and value of the first tuning current associated with operation of the semiconductor laser at the first output channel after operation of the semiconductor laser during the first period; and
wherein the updated value of the second tuning current associated with operation of the semiconductor laser at the second output channel is equal to value of the second tuning current associated with operation of the semiconductor laser at the second output channel after operation of the semiconductor laser for the first period when the difference between the in field value of the first tuning current associated with operation of the semiconductor laser at the first output channel during the second period and the value of the first tuning current associated with operation of the semiconductor laser at the first output channel after operation of the semiconductor laser for the first period is less than a predetermined threshold.

10. A method for operating a tunable DBR laser comprising the steps of:
determining an aging vector in accordance with a ratio of change in a value of a non-local channel tuning characteristic associated with transmission at a non-local channel and change in a value of a local channel tuning characteristic associated with transmission at a local channel that results from operation of said tunable DBR laser for a first period of time;
measuring an in field value of the local channel tuning characteristic associated with transmission at the local channel during a second period of time;
updating the value of the non-local channel tuning characteristic associated with transmission at the non-local channel in accordance with the measured in field value of the local channel tuning characteristic associated with transmission at the local channel and said aging vector.

11. The method of claim 10 further comprising the step of determining difference between value of local channel tuning current associated with transmission at the local channel after the operation of the DBR laser during the first period and the in field value of the local channel tuning characteristic associated with transmission at the local channel.

12. The method of claim 11 wherein the step of updating the value of the non-local channel tuning characteristic associated with transmission at the non-local channel comprises updating the value of the non-local channel tuning characteristic associated with transmission at the non-local channel in accordance with product of the aging vector and the difference between the value of the local channel tuning current associated with transmission at the local channel after operation of the DBR laser for the first period and the in field value of the local channel tuning characteristic associated with transmission at the local channel.

13. The method of claim 10 wherein the step of determining an aging vector comprises determining an aging vector in accordance with an empirical estimation of change in said tuning characteristic when an aging parameter is less than a predetermined threshold.

14. The method of claim 10 wherein the step of determining an aging vector comprises determining an aging vector in accordance with measured changes in the tuning characteristic when an aging parameter is greater than a predetermined threshold.

15. The method of claim 10 further comprising the step of discarding said tunable DBR when an aging parameter is greater than a predetermined threshold.

16. The method of claim 10 wherein said DBR laser is driven by a predetermined current during the first period of time.

17. An apparatus comprising:
a DBR laser transmitting at a local channel;
a measurement apparatus for measuring a first value of a local channel tuning current associated with transmission at the local channel during a first period of time; and
a controller, coupled to said DBR for switching operation of said DBR laser from the local channel to a non-local channel in accordance with change in a the local channel tuning current associated with transmission at a the local channel to change in a non-local channel tuning current associated with transmission at a non-local channel that results from operation of the DBR laser for a second period of time and the first value of the local channel tuning current associated with transmission at the local channel during the first period of time.

18. The apparatus of claim 17 further comprising a closed loop tuning current feedback device coupled to said controller that compensates for drift in the local channel tuning current that results from operation of the DBR laser.

19. The apparatus of claim 18 wherein the tuning current feedback device is optically coupled to said DBR laser and wherein the tuning current feedback device generates a calibration signal indicative of changes in SMSR of said DBR and wherein said controller adjust the tuning current applied to said DBR to compensate for aging of the tuning current in the DBR.

20. The apparatus of claim 17 wherein the meter comprises an ammeter for measuring value of the tuning current applied to a tuning section of the DBR laser.

* * * * *